US009564746B2

United States Patent
Kawamura

(10) Patent No.: US 9,564,746 B2
(45) Date of Patent: Feb. 7, 2017

(54) LEAKAGE-BLOCKING STRUCTURE, ELECTRONIC COMPONENT, AND ELECTRONIC COMPONENT UNIT

(71) Applicant: YAZAKI CORPORATION, Tokyo (JP)

(72) Inventor: Yukihiro Kawamura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 43 days.

(21) Appl. No.: 14/822,131

(22) Filed: Aug. 10, 2015

(65) Prior Publication Data
US 2016/0049780 A1 Feb. 18, 2016

(30) Foreign Application Priority Data
Aug. 12, 2014 (JP) .................................. 2014-164377

(51) Int. Cl.
| H05K 5/02 | (2006.01) |
| H02G 3/18 | (2006.01) |
| H01R 13/518 | (2006.01) |
| B60R 16/023 | (2006.01) |

(52) U.S. Cl.
CPC .............. *H02G 3/18* (2013.01); *H01R 13/518* (2013.01); *H05K 5/0247* (2013.01); *B60R 16/0238* (2013.01); *B60R 16/0239* (2013.01)

(58) Field of Classification Search
CPC .. B60R 16/0239; H01R 13/518; H05K 5/0247
USPC ........................................................ 439/76.2
See application file for complete search history.

(56) References Cited

U.S. PATENT DOCUMENTS

| 6,231,370 B1* | 5/2001 | Morin | H01R 12/57 361/807 |
| 2003/0077927 A1* | 4/2003 | Momota | H01R 9/226 439/76.2 |
| 2003/0236008 A1* | 12/2003 | Kita | H01R 13/6335 439/76.2 |
| 2004/0043645 A1* | 3/2004 | Yamakawa | H01R 4/029 439/76.2 |
| 2005/0009384 A1* | 1/2005 | Perhats | H01R 4/48 439/76.1 |
| 2005/0208793 A1* | 9/2005 | Takeuchi | H01R 13/518 439/76.2 |

(Continued)

FOREIGN PATENT DOCUMENTS

JP 2010-221787 A 10/2010

*Primary Examiner* — Hung V Ngo
(74) *Attorney, Agent, or Firm* — Sughrue Mion, PLLC

(57) ABSTRACT

An electronic component unit includes an electronic component having a plurality of terminals that are exposed outside a housing and extend along wall surfaces of the housing, a holding member holding opposite terminals into which the terminals are fitted, and a leakage-blocking structure. The leakage-blocking structure has housing-side wall surfaces provided to the housing of the electronic component and interposed between the terminals adjacent to each other in an alignment direction of the terminals, holding-member-side wall surfaces provided to the holding member and interposed between the terminals adjacent to each other in the alignment direction of the terminals, and overlapping portions formed in such a manner that the housing-side wall surfaces overlap the holding-member-side wall surfaces in the alignment direction of the terminals.

4 Claims, 10 Drawing Sheets

(56) References Cited

U.S. PATENT DOCUMENTS

| | | | | |
|---|---|---|---|---|
| 2006/0205248 A1* | 9/2006 | Cecconi | ............... | H01H 50/02 439/76.2 |
| 2008/0254654 A1* | 10/2008 | Ito | ............... | H01R 9/2466 439/76.2 |
| 2013/0043971 A1* | 2/2013 | Chen | ............... | H01H 85/2045 337/205 |
| 2014/0106580 A1* | 4/2014 | Sato | ............... | B60R 16/0239 439/76.2 |
| 2014/0159837 A1* | 6/2014 | Hiraiwa | ............... | H01H 9/443 335/201 |

* cited by examiner

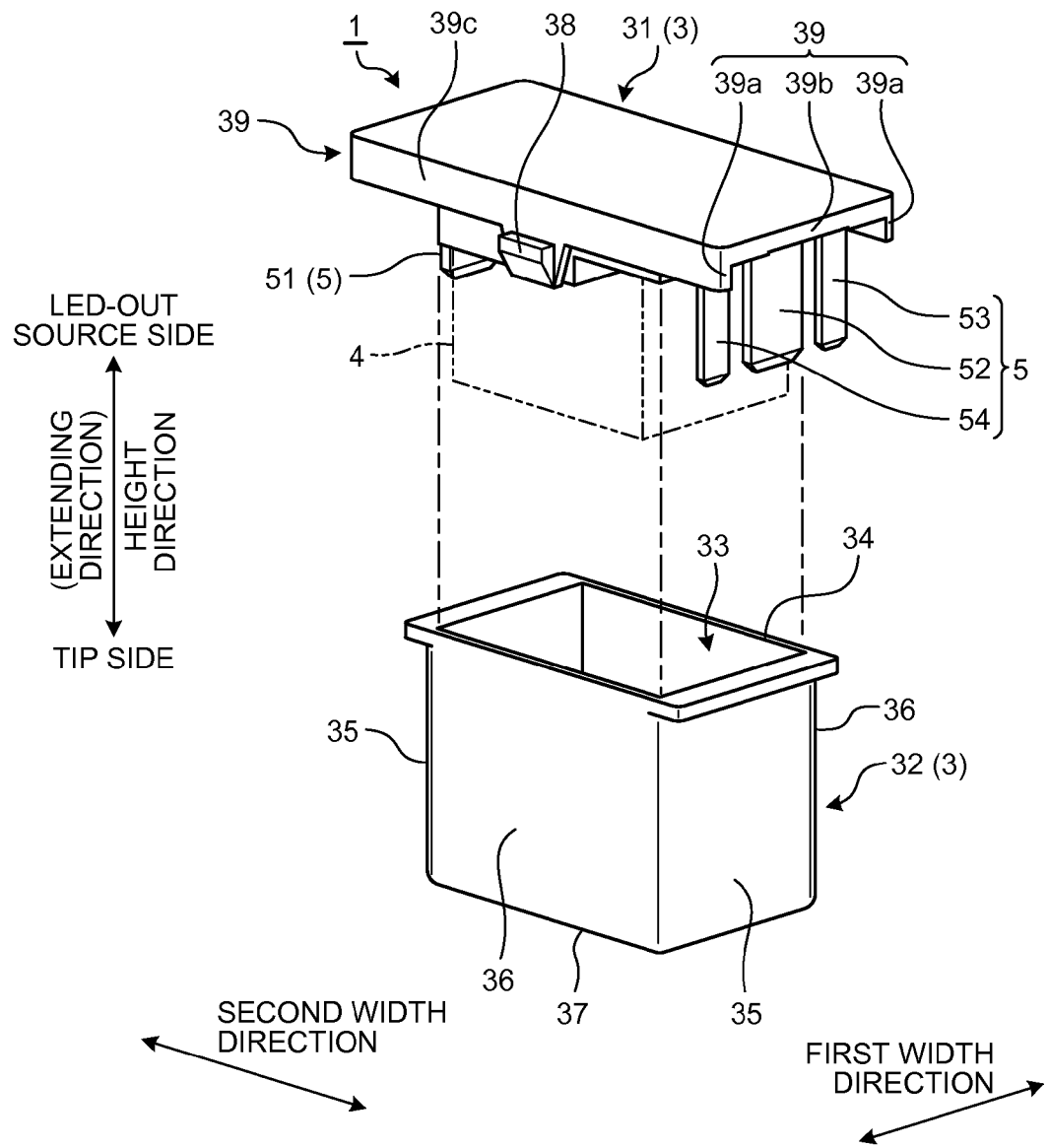

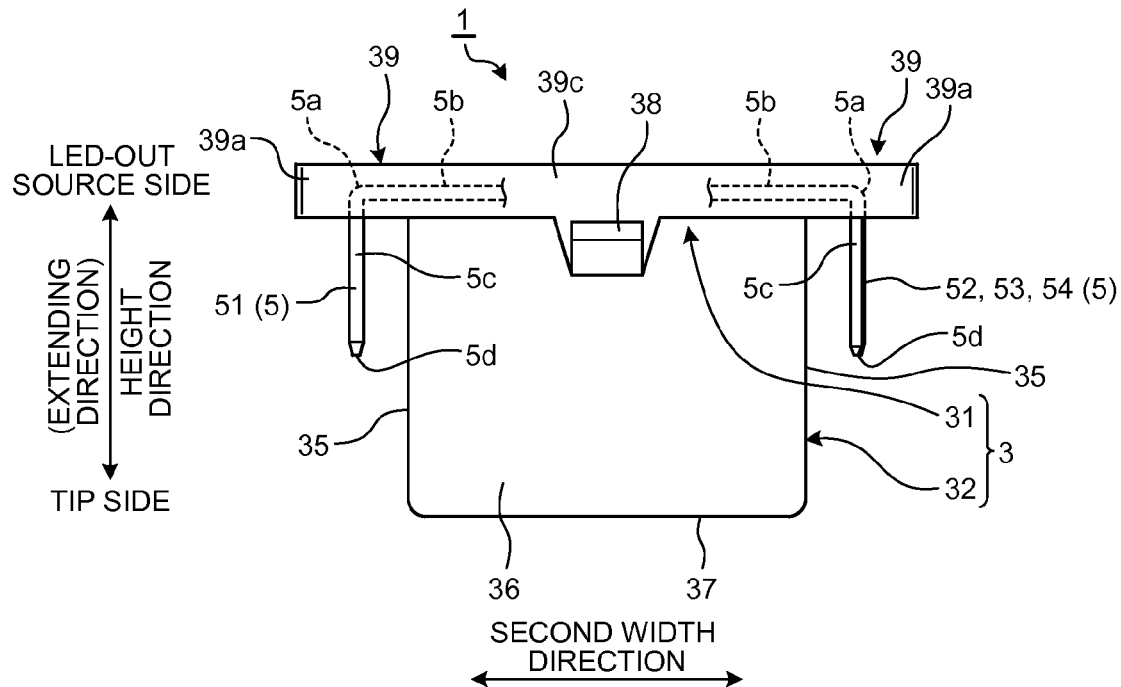
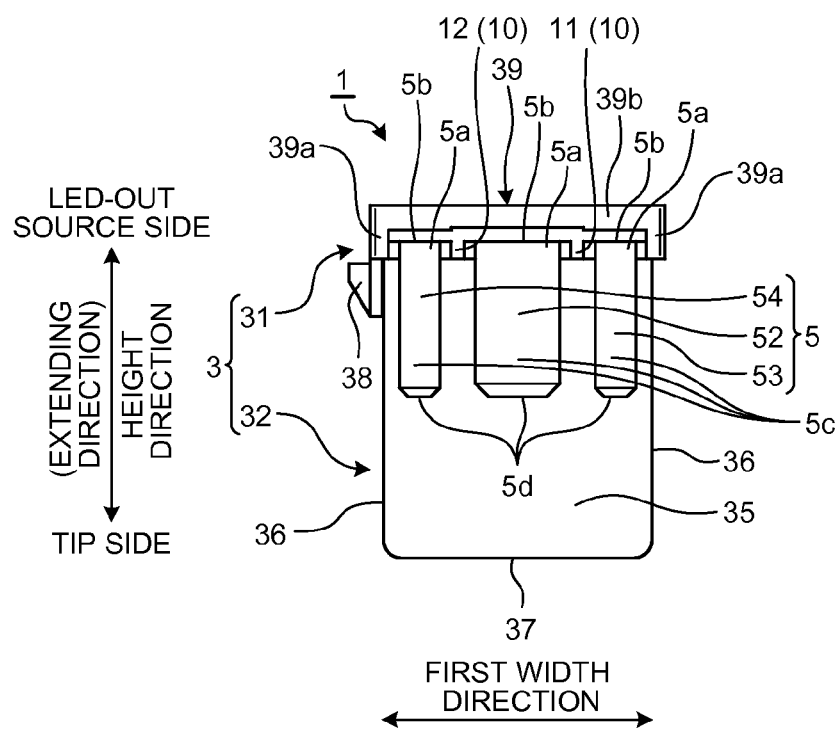

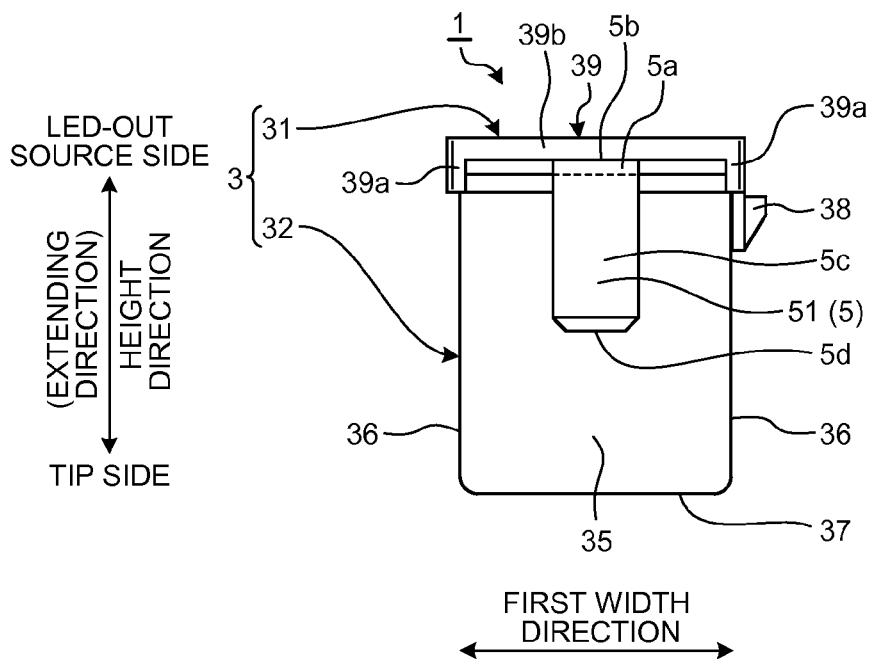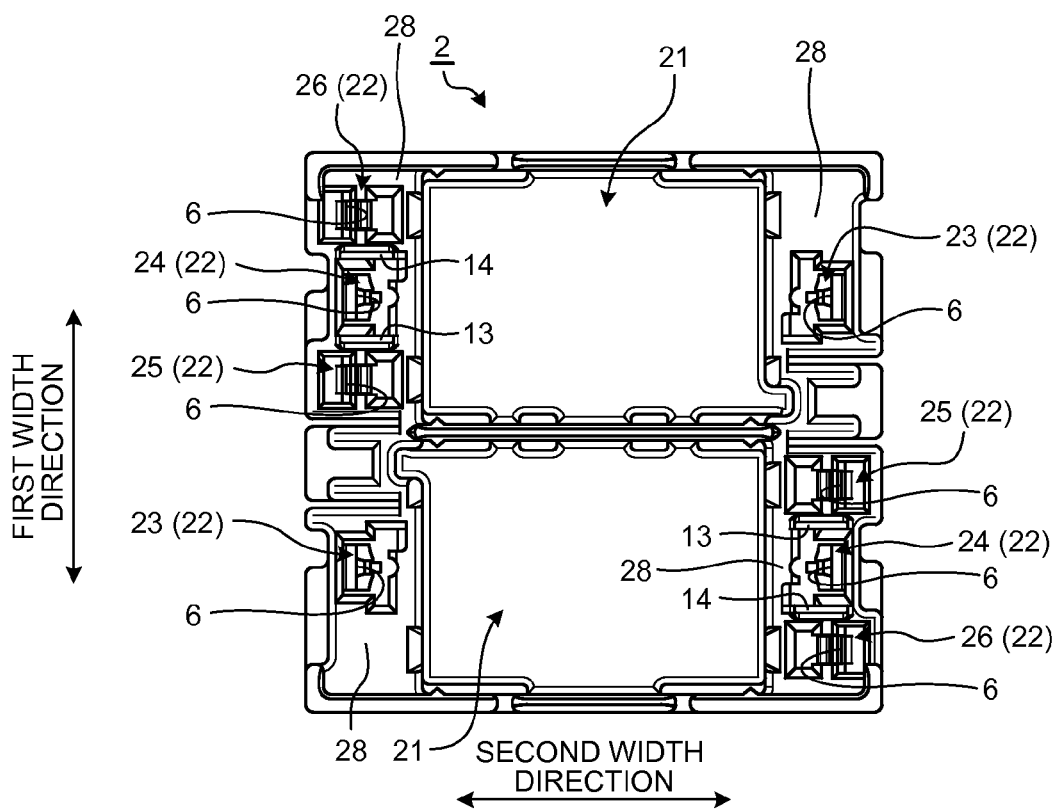

LEAKAGE-BLOCKING STRUCTURE, ELECTRONIC COMPONENT, AND ELECTRONIC COMPONENT UNIT

CROSS-REFERENCE TO RELATED APPLICATION(S)

The present application claims priority to and incorporates by reference the entire contents of Japanese Patent Application No. 2014-164377 filed in Japan on Aug. 12, 2014.

BACKGROUND OF THE INVENTION

1. Field of the Invention

The present invention relates to a leakage-blocking structure, an electronic component, and an electronic component unit.

2. Description of the Related Art

Japanese Patent Application Laid-open No. 2010-221787, for example, discloses an electrical junction box (junction box) including, as conventional electronic components incorporated in a vehicle, electronic components such as relay modules configured to control connection between a power-supply device and electrical components.

The electronic components assembled to the electrical junction box described in Japanese Patent Application Laid-open No. 2010-221787 above need further improvement, for example, in prevention of leakage between adjacent terminals that the electronic components have.

SUMMARY OF THE INVENTION

The present invention has been made in view of the above-described circumstance, and aims to provide a leakage-blocking structure, an electronic component, and an electronic component unit that can prevent leakage between adjacent terminals.

In order to achieve the above mentioned object, a leakage-blocking structure according to one aspect of the present invention includes a housing-side wall surface provided to a housing of an electronic component having a plurality of terminals that are exposed outside the housing and extend along a wall surface of the housing, the housing-side wall surface being interposed between the terminals adjacent to each other in an alignment direction of the terminals; a holding-member-side wall surface provided to a holding member holding opposite terminals into which the terminals are fitted, the holding-member-side wall surface being interposed between the terminals adjacent to each other in the alignment direction of the terminals; and an overlapping portion formed in such a manner that the housing-side wall surface overlaps the holding-member-side wall surface in the alignment direction of the terminals.

Further, in the leakage-blocking structure, it is possible to configure that the terminals are led out from inside to outside of the housing to be exposed and extend along the wall surface of the housing, the housing is formed in a box shape, and has an overhanging portion that is formed so that ends of an end surface of the housing on a side to which the terminals are led out and on a led-out source side of an extending direction of the terminals protrude more than the terminals, and the housing-side wall surface is formed on the overhanging portion.

In order to achieve the above mentioned object, an electronic component according to another aspect of the present invention includes a housing formed in a box shape; a plurality of terminals exposed outside the housing and extending along a wall surface of the housing; and a housing-side wall surface provided to the housing and interposed between the terminals adjacent to each other in an alignment direction of the terminals, wherein the housing-side wall surface overlaps, in the alignment direction of the terminals, a holding-member-side wall surface provided to a holding member holding opposite terminals into which the terminals are fitted, the holding-member-side wall surface being interposed between the terminals adjacent to each other in the alignment direction of the terminals.

In order to achieve the above mentioned object, an electronic component unit according to still another aspect of the present invention includes an electronic component having a plurality of terminals that are exposed outside a housing and extend along a wall surface of the housing; a holding member configured to hold opposite terminals into which the terminals are fitted; and a leakage-blocking structure including a housing-side wall surface provided to the housing of the electronic component and interposed between the terminals adjacent to each other in an alignment direction of the terminals, a holding-member-side wall surface provided to the holding member and interposed between the terminals adjacent to each other in the alignment direction of the terminals, and an overlapping portion formed in such a manner that the housing-side wall surface overlaps the holding-member-side wall surface in the alignment direction of the terminals.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is an exploded perspective view illustrating a schematic configuration of the electronic component according to the embodiment;

FIG. 5 is a side view on a long side of the electronic component according to the embodiment;

FIG. 6 is a side view on a short side of the electronic component according to the embodiment;

FIG. 7 is a side view on a short side of the electronic component according to the embodiment;

FIG. 8 is a plan view of an accommodating member to which the electronic components according to the embodiment are assembled;

DETAILED DESCRIPTION OF THE PREFERRED EMBODIMENTS

An embodiment according to the present invention will be described hereinafter in detail with reference to the drawings. It should be noted that this invention is not limited to this embodiment. The components in the following embodiment include components that the skilled person can replace or easily replaces, or components that are substantially the same.

Embodiment

Figure 1:
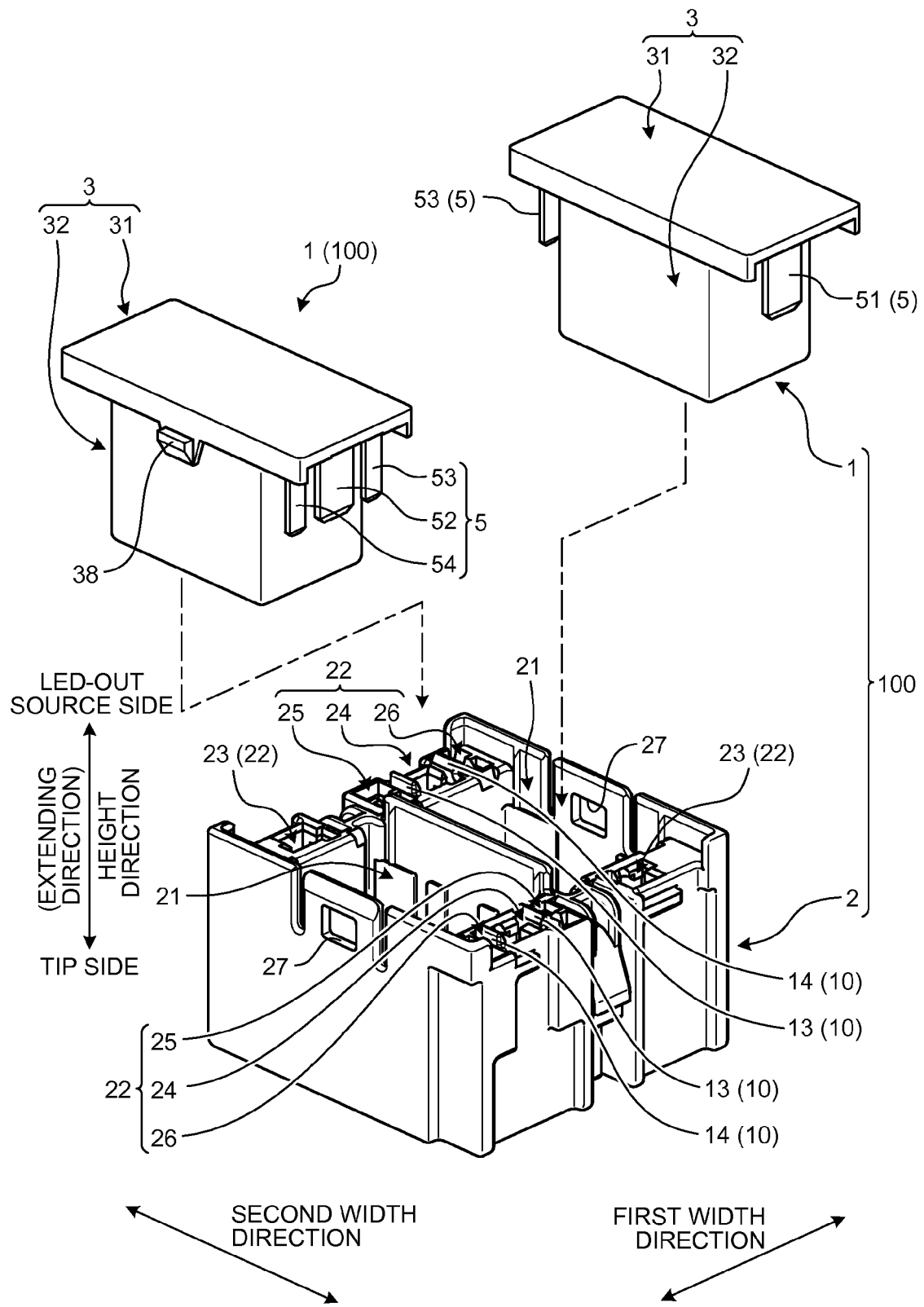
FIG. 1 is an exploded perspective view of an electronic component unit in which electronic components according to an embodiment are used.
Figure 2:
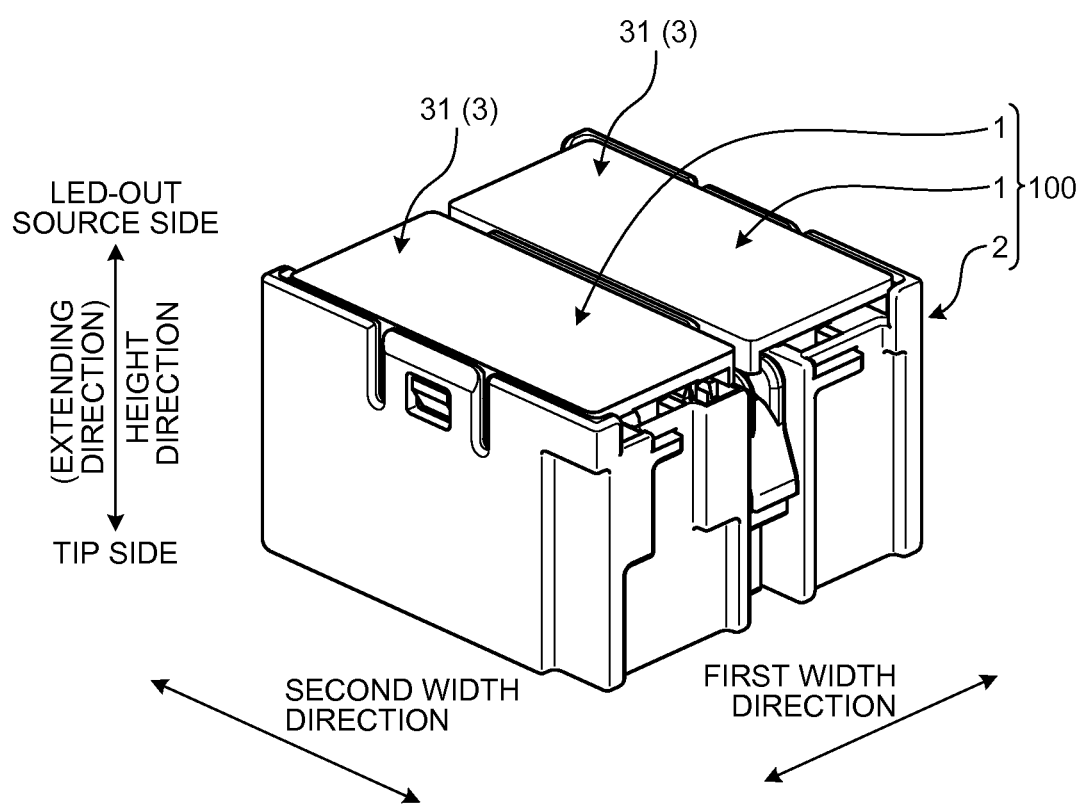
FIG. 2 is a perspective view of the electronic component unit in which the electronic components according to the embodiment are used.
Figure 3:
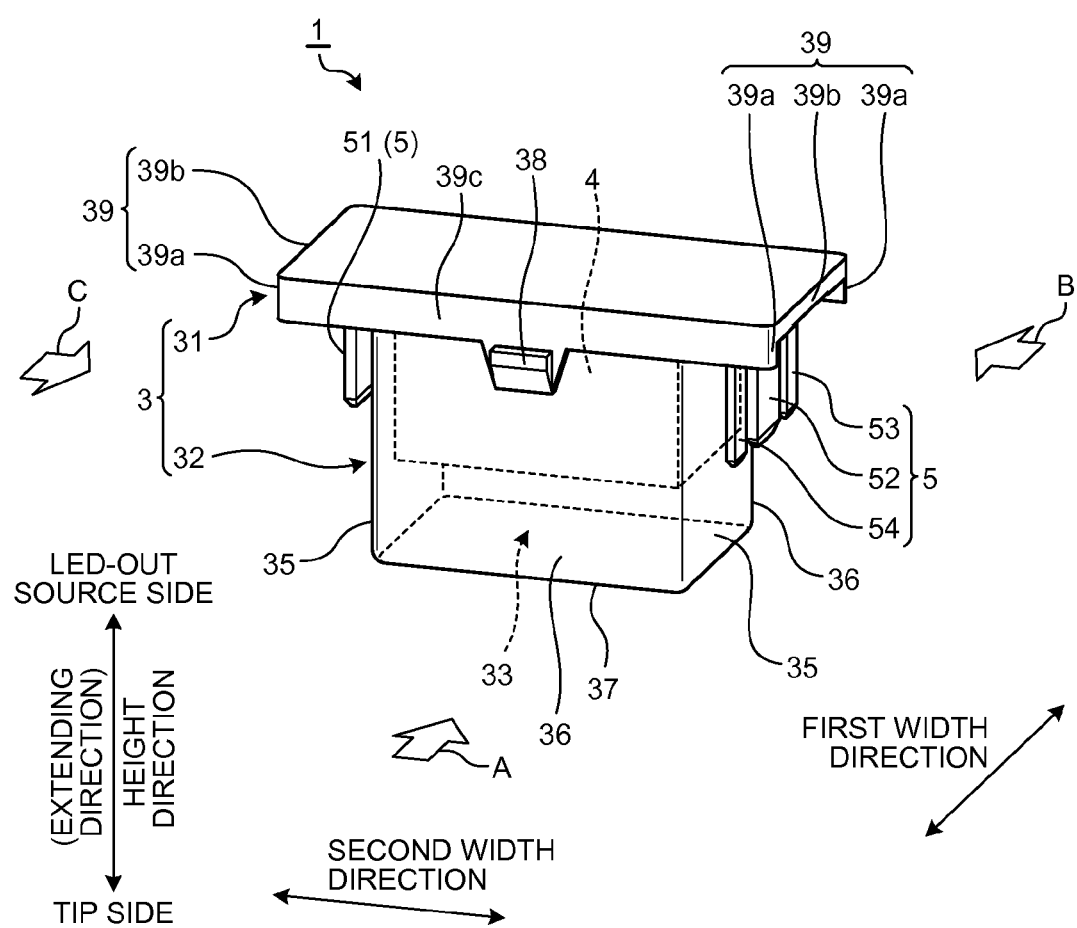
FIG. 3 is a perspective view illustrating a schematic configuration of an electronic component according to the embodiment.
Figure 9:
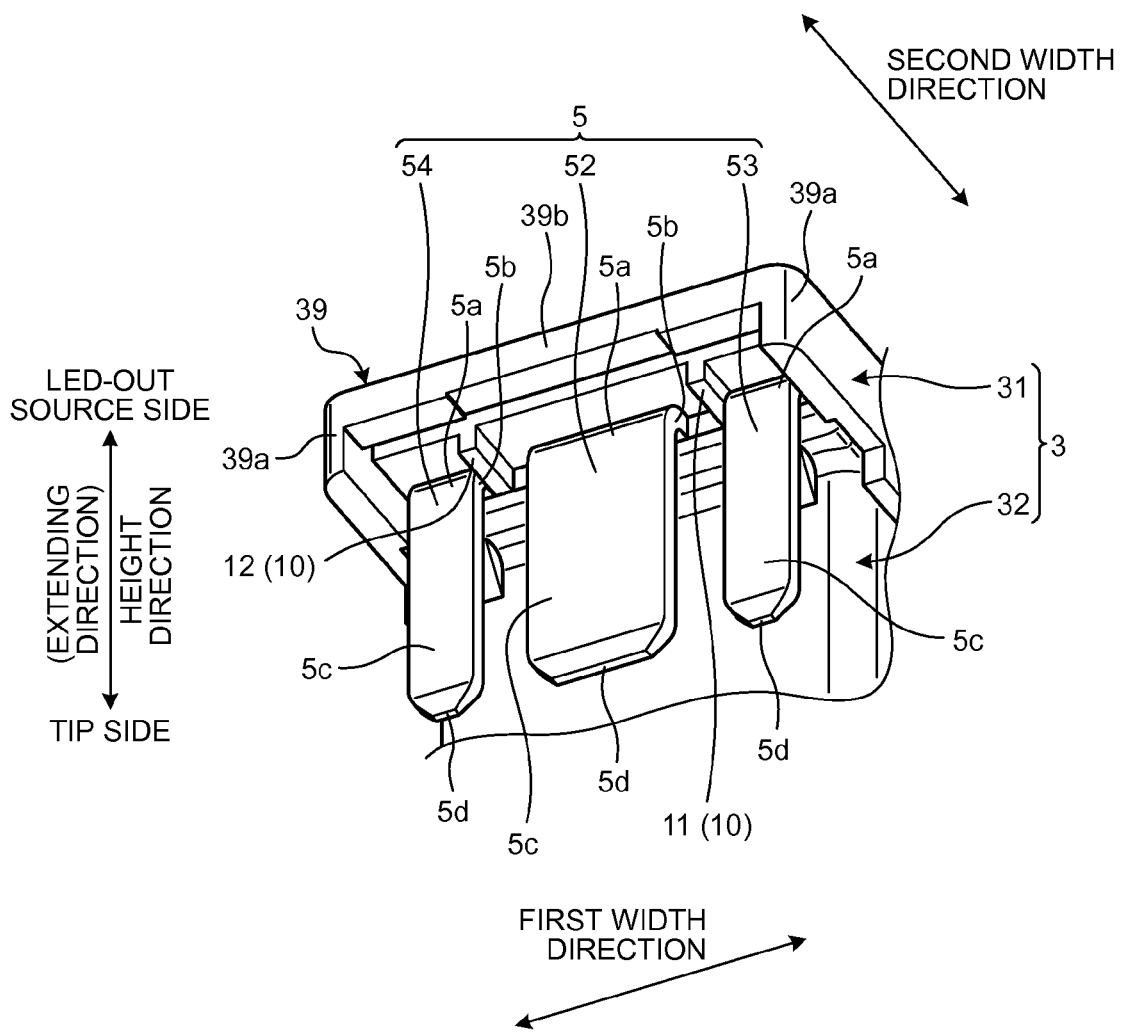
FIG. 9 is a partial perspective view near a housing-side wall surface of an electronic component according to the embodiment.
Figure 10:
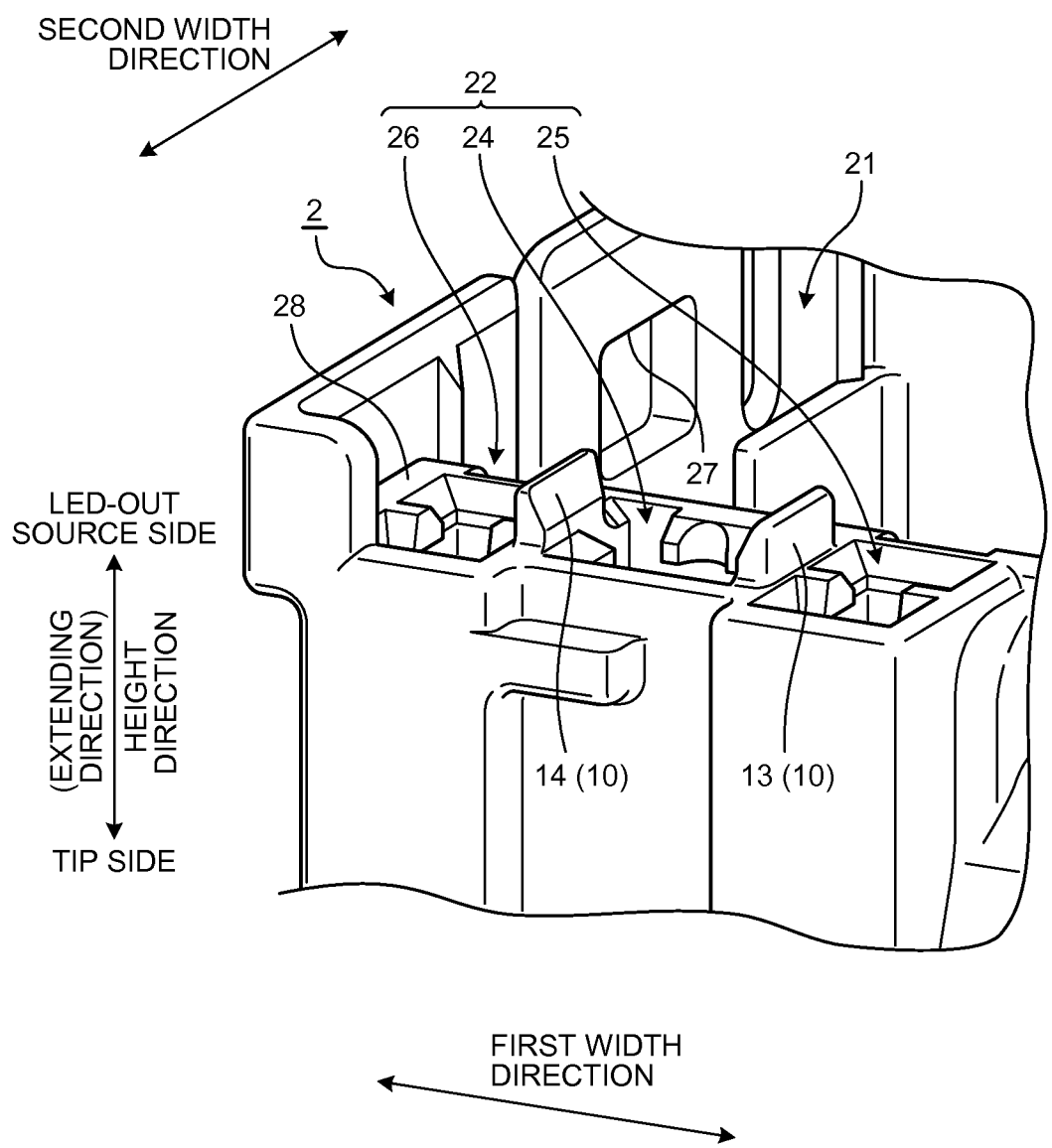
FIG. 10 is a partial perspective view near an accommodating-member-side wall surface of the accommodating member according to the embodiment.
Figure 11:
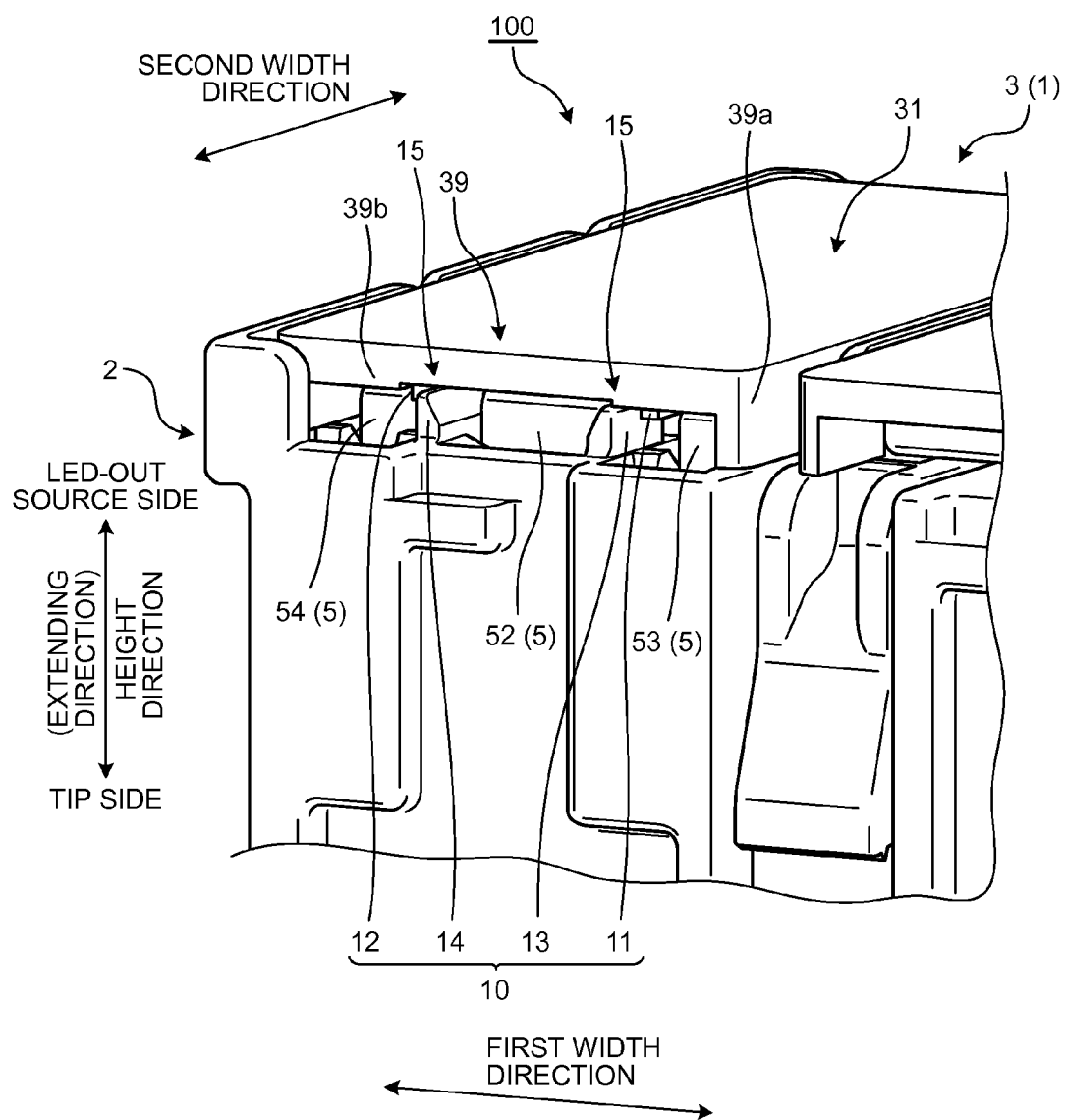
FIG. 11 is a partial perspective view including a leakage-blocking structure according to the embodiment.
Figure 12:
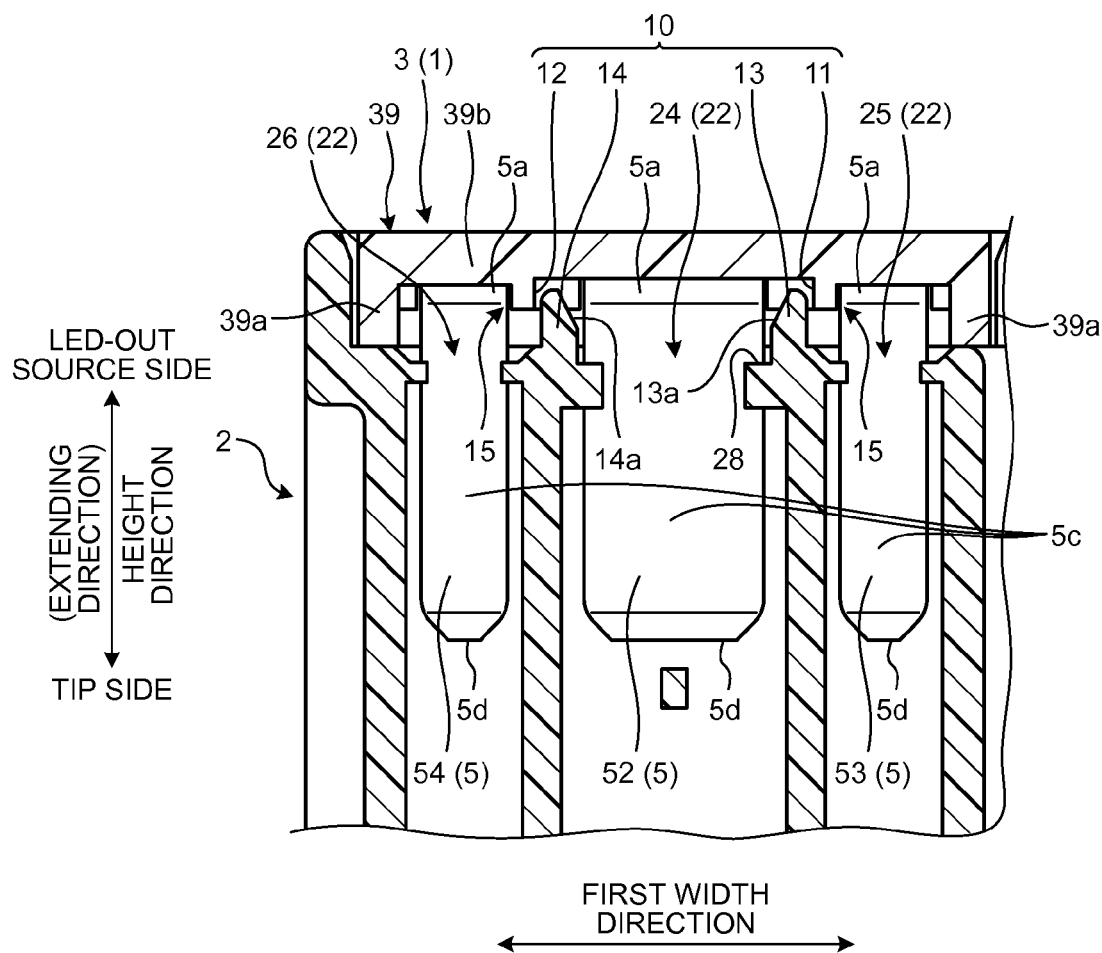
FIG. 12 is a partial sectional view along a first width direction including the leakage-blocking structure according to the embodiment.

FIG. 1 is an exploded perspective view of an electronic component unit in which electronic components according to an embodiment are used. FIG. 2 is a perspective view of the electronic component unit in which the electronic components according to the embodiment are used. FIG. 3 is a perspective view illustrating a schematic configuration of an electronic component according to the embodiment. FIG. 4 is an exploded perspective view illustrating a schematic configuration of the electronic component according to the embodiment. FIG. 5 is a side view on a long side (view from the arrow A indicated in FIG. 3) of the electronic component according to the embodiment. FIG. 6 is a side view on a short side (view from the arrow B indicated in FIG. 3) of the electronic component according to the embodiment. FIG. 7 is a side view on a short side (view from the arrow C indicated in FIG. 3) of the electronic component according to the embodiment. FIG. 8 is a plan view of an accommodating member to which the electronic components according to the embodiment are assembled. FIG. 9 is a partial perspective view near a housing-side wall surface of an electronic component according to the embodiment. FIG. 10 is a partial perspective view near an accommodating-member-side wall surface of the accommodating member according to the embodiment. FIG. 11 is a partial perspective view including a leakage-blocking structure according to the embodiment. FIG. 12 is a partial sectional view along a first width direction including the leakage-blocking structure according to the embodiment. In FIG. 4, an electronic component main body is indicated by alternate long and two short dashes line.

As depicted in FIGS. 1 and 2, electronic components 1 according to the present embodiment are used in an electronic component unit 100, and are detachably assembled to an electrical junction box incorporated in a vehicle such as an automobile. The electrical junction box herein accommodates electrical components such as connectors, fuses, relays, branch portions, and electronic control units constituting connection-processing components such as wire harnesses and electric wires in an integrated manner. The electrical junction box is placed in an engine compartment of the vehicle or in a lower portion of the vehicle body, for example, and is connected between an electric-power source such as a battery and various electronic devices incorporated in the vehicle. The electrical junction box distributes electric power supplied from the electric-power source to the various electronic devices in the vehicle. Although the electrical junction box may be called a junction box, a fuse box, or a relay box, for example, these are collectively called an electrical junction box in the present embodiment. In the electrical junction box, a housing including a frame, an upper cover, and a lower cover that are formed of insulating synthetic resin accommodates various electronic components including the electronic components 1. In the electrical junction box, many cavities are formed by partition walls having various shapes that are formed in an integrated manner on the frame and blocks having various shapes that are detachably assembled to the frame. The various electronic components including the electronic components 1 are each assembled into the cavities. The electrical junction box is electrically connected by fitting terminals of electric wires, for example, into the cavities to which the various electronic components including the electronic components 1 are assembled.

The electronic component unit 100 in which the electronic components 1 of the present embodiment are used includes the electronic components 1 and an accommodating member 2 as a holding member. The electronic component unit 100 exemplified in FIGS. 1 and 2 is illustrated as a unit including two electronic components 1, but is not limited to this, and the number of the electronic components 1 may be one or may be three or more. These two electronic components 1 have the same configuration. Furthermore, as depicted in FIGS. 9, 10, 11, and 12, the electronic component unit 100 of the present embodiment has a leakage-blocking structure 10 to prevent leakage between adjacent terminals 5 of the electronic components 1.

To begin with, referring to FIGS. 3, 4, 5, 6, and 7, the schematic configuration of the electronic component 1 will be described. The electronic component 1 includes a housing 3, an electronic component main body 4, and terminals 5.

In the following description, the extending direction in which the terminals 5 exposed outside the housing 3 extend may be referred to as the "height direction", one side of the extending direction (height direction) may be referred to as the "led-out source side", and the other side thereof may be referred to as the "tip side". In the following description, the respective two directions orthogonal to the extending direction (height direction) may be referred to as the "first width direction" and the "second width direction". Typically, the extending directions (height directions) as the first direction, the first width direction as the second direction, and the second width direction as the third direction are orthogonal to each other.

The housing 3 accommodates therein the electronic component main body 4. The housing 3 is a container formed in a box shape. The housing 3 includes a base 31 and a case 32. Both the base 31 and the case 32 are formed of insulating synthetic resin. The base 31 is a lid-like member formed in a shape of rectangular plate, and the electronic component main body 4 is assembled thereto. In the base 31 herein, the first width direction corresponds to the short-side direction, and the second width direction corresponds to the long-side direction. The case 32 is a box-like member formed in a shape of hollow rectangular parallelepiped box, and covers the electronic component main body 4 assembled to the base 31. A hollow portion formed inside the case 32 serves as an accommodating space 33 configured to accommodate the electronic component main body 4. In the case 32, on the led-out source side of the height direction (extending direction) of the accommodating space 33, an opening 34 is formed (see FIG. 4, etc.). In the case 32 herein, the accommodating space 33 is defined by a pair of wall surfaces 35 opposing each other in the second width direction, a pair of wall surfaces 36 opposing each other in the first width direction, and a bottom 37 positioned on the height-direction tip side, with the opening 34 formed on the led-out source side of the height direction. Four surfaces of the pair of wall surfaces 35 and the pair of wall surfaces 36 serve as side surfaces of the case 32. The base 31, to which the electronic component main body 4 is assembled, is assembled to the case 32 in a positional relation to cover the opening 34 of the case 32, and is locked by a locking mechanism in various types (see FIG. 4, etc.). In other words, in the housing 3, the base 31 is positioned on the led-out source side of the height direction, and the case 32 is positioned on the tip side of the height direction. The housing 3 is formed by combining the base 31 and the case 32 as a whole in a shape of rectangular parallelepiped box, and the accommodating space 33 formed therein accommodates the electronic component main body 4. In the housing 3, an engaging protrusion 38 is formed on one end surface of the base 31 along the second width direction (long-side direction). The engaging protrusion 38 is an engaging claw configured to engage with the accommodating member 2 described later, and is formed substantially at the center in the second width direction.

The electronic component main body 4 is accommodated by the housing 3. The electronic component main body 4 is a component used for electric products, and examples thereof include a connector, a fuse, a relay, a branch portion, and an electronic control unit. It is assumed in the description herein that the electronic component main body 4 is a relay (electromagnetic relay) that controls connection between a power supply device, for example, and an electrical component by physically moving a point of contact with an electromagnet including a coil, for example.

The terminals 5 are led out from the inside to the outside of the housing 3 to be exposed, and extend along wall surfaces of the housing 3 that are herein wall surfaces 35 forming end surfaces of the case 32 of the housing 3 in the second width direction (long-side direction). The terminals 5 each are a plate-like lead terminal including a conductive metal bus bar that is electrically connected to the electronic component main body 4. The terminals 5 may be called tabs. The electronic component 1 herein includes a plurality of terminals 5. More specifically, the electronic component 1 includes four terminals as the terminals 5, i.e., a first terminal 51, a second terminal 52, a third terminal 53, and a fourth terminal 54. The first terminal 51 extends facing one of the wall surfaces 35 forming end surfaces of the case 32 in the second width direction (long-side direction). The second terminal 52, the third terminal 53, and the fourth terminal 54 extend facing the other of the wall surfaces 35 forming the end surfaces of the case 32 in the second width direction. In other words, the first terminal 51 and a group of the second terminal 52, the third terminal 53, and the fourth terminal 54 overhang in the directions separating from each other along the second width direction at the respective wall surfaces 35 of the housing 3 opposing each other in the second width direction, and are each formed along the respective wall surfaces 35. The first terminal 51 is positioned substantially at the center of one of the wall surfaces 35 in the first width direction (see FIG. 7, etc.). As for the second terminal 52, the third terminal 53, and the fourth terminal 54, the second terminal 52 is positioned substantially at the center of the other of the wall surfaces 35 in the first width direction, and the third terminal 53 and the fourth terminal 54 are positioned spaced apart from each other on both sides of the second terminal 52 in the first width direction (see FIG. 6, etc.). Among the second terminal 52, the third terminal 53, and the fourth terminal 54, the second terminal 52 is formed relatively wider than the third terminal 53 and the fourth terminal 54. In the following description, when it is not necessary for the description to differentiate between the first terminal 51, the second terminal 52, the third terminal 53, and the fourth terminal 54, these may be simply referred to as the "respective terminals 5".

More specifically, the respective terminals 5 are led outside the housing 3 from the electronic component main body 4 to be exposed. The respective terminals 5 are led out from the inside to the outside of the housing 3 on the side of the base 31, i.e., on the led-out source side of the height direction, and extend toward the tip side of the height direction. The respective terminals 5 protrude along the second width direction on the side of the base 31, i.e., on the led-out source side of the height direction, and also bend at bent portions 5a (see FIGS. 6 and 7, etc.) toward the height-direction tip side. The respective terminals 5 then protrude toward the tip side of the height direction, extending along the respective wall surfaces 35. In this manner, the respective terminals 5 protrude toward sides separating from the wall surfaces 35 so as to be spaced apart from the wall surfaces 35 forming the end surfaces of the case 32 of the housing 3 in the second width direction, and thus have shapes overhanging from the housing 3. The respective terminals 5 on the led-out source side of the height direction are base-end portions (led-out portion) 5b (see FIGS. 5, 6, and 7, etc.) overhanging along the second width direction, and the respective terminals 5 on the tip side of the height direction from the bent portions 5a are contact portions 5c (see FIGS. 5, 6, and 7, etc.) being in contact with opposite terminals 6. In the height direction, the positions of the bent portions 5a and the positions of tips 5d (see FIGS. 5, 6, and 7, etc.) of the respective terminals 5 are substantially the same. The respective terminals 5 on the side of the base-end portions 5b (i.e., on the side of electronic component main body 4) are provided to a surface of the base 31 on the height-direction tip side in an integrated manner by insert molding, for example.

The housing 3 of the present embodiment further has overhanging portions 39. The overhanging portions 39 are eaves-like portions of the base 31 that overhang from the case 32. The overhanging portions 39 overhang from the case 32 along the second width direction. The overhanging portions 39 are formed so that ends of end surfaces of the base 31 on the sides to which the respective terminals 5 are led out and on the led-out source side of the extending direction of the respective terminals 5 protrude more than the terminals 5 toward the sides to which the terminals 5 are led out. In other words, the overhanging portions 39 are formed so that ends of end surfaces of the base 31 on the sides of the respective wall surfaces 35 facing the respective terminals 5 and on the led-out source side of the extending direction of the respective terminals 5 protrude more than the respective terminals 5 toward the sides separating from the respective wall surfaces 35 so as to cover the respective terminals 5 on the height-direction led-out source side. The overhanging portions 39 herein are provided as a pair on both sides of the base 31 in the second width direction.

More specifically, the overhanging portions 39 each include a pair of protruding portions 39a and a plate portion 39b. The pair of protruding portions 39a are formed in such a manner that, in end surfaces of the base 31 on the sides to which the respective terminals 5 are led out, both outer ends in the width direction of the ends on the led-out source side of the extending direction in which the respective terminals 5 extend protrude more than the respective terminals 5 toward the sides to which the terminals 5 are led out. In other words, the pair of protruding portions 39a are formed in such a manner that, in end surfaces of the base 31 on the sides of the respective wall surfaces 35, both outer ends in the width direction of the ends on the led-out source side of the extending direction of the respective terminals 5 protrude more than the respective terminals 5 toward the sides separating from the respective wall surfaces 35. The protruding amounts of the pair of protruding portions 39*a* are substantially the same. The plate portion 39*b* is a plate-like portion connecting the pair of protruding portions 39*a*. The plate portion 39*b* is formed so as to cover a space between the pair of protruding portions 39*a* along the first width direction. The pair of protruding portions 39*a* herein are formed so that the length thereof along the height direction (extending direction) is greater than that of the plate portion 39*b*. The pair of protruding portions 39*a* are formed so as to protrude from the plate portion 39*b* toward the height-direction tip side. In other words, the overhanging portions 39 each are formed of the pair of protruding portions 39*a* and the plate portion 39*b* in an integrated manner, and are formed substantially in a U-shape with its opening facing the height-direction tip side in the side views seen from the second width direction (sides on the short side depicted in FIGS. 6 and 7). Herein, the respective protruding portions 39*a* on one side of the second width direction and the respective protruding portions 39*a* on the other side thereof form beam portions 39*c* each of which continuously extends along the second width direction. The respective beam portions 39*c* are formed along the second width direction on both end surfaces of the base 31 in the first width direction. The above-described engaging protrusion 38 is formed substantially at the center of one of the beam portions 39*c* in the second width direction.

The above-described respective terminals 5 on the height-direction and the led-out source side are covered by the respective overhanging portions 39 of the base 31. Herein, as depicted in FIGS. 6 and 7, for example, the bent portions 5*a* of the respective terminals 5 are positioned outside the housing 3 near surfaces of the respective overhanging portions 39 on the height-direction tip side, but the positions are not limited to this. For example, the respective terminals 5 may be provided in a manner integrated with the base 31 so as to protrude directly from the respective overhanging portions 39 toward the height-direction tip side and extend along the wall surfaces 35. In other words, the respective terminals 5 may be formed so that the bent portions 5*a* and the base-end portions 5*b* are surrounded by a synthetic resin forming the base 31 and the contact portions 5*c* protrude toward the height-direction tip side and extend along the wall surfaces 35.

The following describes a schematic configuration of the accommodating member 2 with reference to FIGS. 1, 2, and 8. The accommodating member 2 is a housing member into which the electronic components 1 are inserted and that accommodates the electronic component 1. The accommodating member 2 may, for example, be part of a frame constituting the electrical junction box or may be part of a block assembled to the frame or may be a member assembled to the frame or the block, for example. The accommodating member 2 is also a holding member that holds the opposite terminals 6. Into the opposite terminals 6, the respective terminals 5 are fitted.

The accommodating member 2 includes main cavities 21 as first accommodating chambers into which the housings 3 of the electronic components 1 are fitted, and sub-cavities 22 as second accommodating chambers that hold the opposite terminals 6 and into which the terminals 5 of the electronic components 1 are fitted. The accommodating member 2 includes wall surfaces such as partition walls that partition the main cavities 21 and the sub-cavities 22, for example, and is formed of insulating synthetic resin in a shape of substantially rectangular parallelepiped box as a whole.

The main cavity 21 is a space formed in a shape of substantially rectangular parallelepiped having a size and shape capable of accommodating the case 32 of the housing 3, and guides and accommodates the case 32 of the housing 3 from its openings on the height-direction and the led-out source side. Herein, two main cavities 21 are formed corresponding to two electronic components 1. The two main cavities 21 are formed adjacent to each other in the first width direction. In the respective main cavities 21, the second width direction corresponds to the long-side direction, and the first width direction corresponds to the short-side direction.

The sub-cavities 22 are spaces each having a size and shape capable of accommodating the respective terminals 5 and extending along the height direction. The sub-cavities 22 hold therein the opposite terminals 6, and also guide and accommodate the tips 5*d* of the respective terminals 5 from the openings on the height-direction and the led-out source side. The sub-cavities 22 are formed in plurality corresponding to a plurality of terminals 5 of the respective electronic components 1. The accommodating member 2 includes eight sub-cavities 22 in total. Specifically, four cavities of a first cavity 23 into which the first terminal 51 is fitted, a second cavity 24 into which the second terminal 52 is fitted, a third cavity 25 into which the third terminal 53 is fitted, and a fourth cavity 26 into which the fourth terminal 54 is fitted are considered as one set, and this one set is provided for each of the respective electronic components 1. With one of the main cavities 21 interposed in the second width direction, the first cavity 23 is formed on one side of this main cavity 21 in the second width direction, and the second cavity 24, the third cavity 25, and the fourth cavity 26 are formed on the other side of this main cavity 21 in the second width direction. In this manner, the sub-cavities 22 are formed. The second cavity 24, the third cavity 25, and the fourth cavity 26 are formed at predetermined intervals along the first width direction. The second cavity 24 is positioned at the center, and the third cavity 25 and the fourth cavity 26 are each formed on both sides of the second cavity 24 in the first width direction. As the sub-cavities 22 for the other of the main cavities 21, the first cavity 23, the second cavity 24, the third cavity 25, and the fourth cavity 26 are formed in the same manner. Herein, one of the main cavities 21 and the first cavity 23, the second cavity 24, the third cavity 25, and the fourth cavity 26 that are formed with this main cavity 21 interposed therebetween are point-symmetrical in shape and positional relation to the other one of the main cavities 21 and the first cavity 23, the second cavity 24, the third cavity 25, and the fourth cavity 26 that are formed with this main cavity 21 interposed therebetween. In other words, these are formed in a shape and positional relation being rotated 180° around an axis in the height direction. Each first cavity 23, each second cavity 24, each third cavity 25, and each fourth cavity 26 correspond to the first terminal 51, the second terminal 52, the third terminal 53, and the fourth terminal 54, respectively, and hold the opposite terminals (herein, female terminals) 6 at predetermined positions. The opposite terminals 6, into which the contact portions 5*c* of the respective terminals 5 are fitted to establish electrical connection, are constructed of conductive terminal metal fittings, and are electrically connected to electric wires, for example.

With the housings 3 of the electronic components 1 being fitted into the main cavities 21, surfaces of the accommodating member 2 on the height-direction and the led-out source side in which openings of the respective sub-cavities 22 are formed are abutment surfaces 28 with the respective protruding portions 39a of the bases 31 (see FIGS. 8 and 10, etc.). In the accommodating member 2, an engaging recess 27 is formed in a wall surface defining each main cavity 21. Each engaging recess 27 engages with the above-described engaging protrusion 38 formed in the base 31, thereby locking each electronic component 1 on the accommodating member 2. Each engaging recess 27 is formed in a wall surface along the second width direction (long-side direction).

In the electronic component unit 100 configured as describe above, the housings 3 of the respective electronic components 1 on the sides of the cases 32 are fitted into the respective main cavities 21 to be accommodated, and also the respective terminals 5 (the first terminal 51, the second terminal 52, the third terminal 53, and the fourth terminal 54) are fitted into the respective sub-cavities 22 (the first cavity 23, the second cavity 24, the third cavity 25, and the fourth cavity 26) to be accommodated. Accordingly, in the electronic component unit 100, the respective terminals 5 of each electronic component 1 are electrically connected to the respective opposite terminals 6 held by the accommodating member 2. In the electronic component unit 100, with the respective terminals 5 being electrically connected to the opposite terminals 6, the engaging protrusion 38 formed on each base 31 engages with each engaging recess 27 formed on the accommodating member 2, thereby locking each electronic component 1 on the accommodating member 2 (see FIG. 2, etc.). In the electronic component unit 100, with each electronic component 1 being locked on the accommodating member 2, each base 31 of the housing 3 is positioned so as to cover the main cavity 21 and the sub-cavities 22 in the height direction. In the electronic component unit 100, with each electronic component 1 being locked on the accommodating member 2, ends of the protruding portions 39a of each base 31 on the height-direction tip side abut the abutment surfaces 28 of the accommodating member 2.

The following describes a schematic configuration of the leakage-blocking structure 10 with reference to FIGS. 9, 10, 11, and 12. The leakage-blocking structure 10 has housing-side wall surfaces 11 and 12, accommodating-member-side wall surfaces 13 and 14 as holding-member-side wall surfaces, and overlapping portions 15.

As depicted in FIG. 9, for example, the housing-side wall surfaces 11 and 12 are interposed between the terminals 5 adjacent to each other in the alignment direction of the terminals 5 provided to the housing 3. The alignment direction of the terminals 5 herein corresponds to the first width direction. The housing-side wall surfaces 11 and 12 are formed on the overhanging portions 39 of the base 31 constituting the housing 3. More specifically, the housing-side wall surfaces 11 and 12 formed as protruding wall surfaces that protrude from the surface on the height-direction tip side of the plate portion 39b constituting the overhanging portions 39 toward the height-direction tip side. The housing-side wall surfaces 11 and 12 have a cross section along the first width direction that is formed in a substantially rectangular shape, and linearly extends to the vicinity of the wall surfaces 35 of the case 32 along the second width direction. In the leakage-blocking structure 10, the housing-side wall surface 11 is formed between the second terminal 52 and the third terminal 53, and the housing-side wall surface 12 is formed between the second terminal 52 and the fourth terminal 54. In other words, the housing-side wall surfaces 11 and 12 are provided to both sides of the second terminal 52 in the first width direction.

The housing-side wall surfaces 11 and 12 are formed in such a positional relation that the tips thereof along the height direction are positioned beside the base-end portions 5b of the respective terminals 5 so as to sandwich the base-end portion 5b of the second terminal 52 along the first width direction.

As depicted in FIGS. 10 and 12, for example, the accommodating-member-side wall surfaces 13 and 14 are provided to the accommodating member 2, and are interposed between the terminals 5 adjacent to each other in the alignment direction of the terminals 5. The alignment direction of the terminal 5 corresponds to the first width direction as described above. The accommodating-member-side wall surfaces 13 and 14 are formed on the abutment surface 28 at which the openings of the respective sub-cavities 22 are formed in the accommodating member 2. More specifically, the accommodating-member-side wall surfaces 13 and 14 are formed as protruding wall surfaces that protrude from the abutment surface 28 toward the height-direction and the led-out source side. The accommodating-member-side wall surfaces 13 and 14 linearly extend from the outer surface of the accommodating member 2 to the vicinity of the main cavity 21 along the second width direction. In the leakage-blocking structure 10, the accommodating-member-side wall surface 13 is formed so as to be positioned between the second terminal 52 and the third terminal 53, and the accommodating-member-side wall surface 14 is formed so as to be positioned between the second terminal 52 and the fourth terminal 54. In other words, the accommodating-member-side wall surfaces 13 and 14 are provided to be positioned at both sides of the second terminal 52 in the first width direction. More specifically, with the electronic component 1 and the accommodating member 2 being assembled together, the accommodating-member-side wall surface 13 is positioned between the first housing-side wall surface 11 and the second terminal 52 in the first width direction, and the accommodating-member-side wall surface 14 is positioned between the housing-side wall surface 12 and the second terminal 52 in the first width direction. Furthermore, on surfaces of the accommodating-member-side wall surfaces 13 and 14 opposing each other in the first width direction, tapered surfaces 13a and 14a are formed, respectively (see FIG. 12, etc.). The tapered surfaces 13a and 14a are guide surfaces configured to catch the tip 5d of the second terminal 52 having the greatest width and the highest strength among the terminals 5 and to guide the tip 5d toward the second cavity 24 when each electronic component 1 is assembled to the accommodating member 2.

As depicted in FIGS. 11 and 12, for example, the overlapping portions 15 are portions formed in such a manner that the housing-side wall surfaces 11 and 12 overlap the accommodating-member-side wall surfaces 13 and 14 in the alignment direction of the terminals 5. In other words, the overlapping portions 15 are portions where the housing-side wall surfaces 11 and 12 overlap the accommodating-member-side wall surfaces 13 and 14 over the extending direction of the terminals 5 orthogonal to (intersecting with) the alignment direction (first width direction) of the terminals 5. The housing-side wall surface 11 and the accommodating-member-side wall surface 13 face each other in the first width direction between the second terminal 52 and the third terminal 53. The housing-side wall surface 12 and the accommodating-member-side wall surface 14 face each other in the first width direction between the second terminal 52 and the fourth terminal 54. These wall surfaces are formed with such protruding amounts that the housing-side wall surfaces 11 and 12 overlap the accommodating-member-side wall surfaces 13 and 14, respectively, in the alignment direction of the terminals 5. Herein, with the housing 3 of the electronic component 1 being fitted into the main cavity 21 to be accommodated and with the electronic component 1 being locked on the accommodating member 2, the accommodating-member-side wall surfaces 13 and 14 are formed with such protruding amounts that the tips thereof along the height direction are positioned beside the base-end portions 5b of the respective terminals 5, sandwiching the base-end portion 5b of the second terminal 52 along the first width direction. The leakage-blocking structure 10 forms a labyrinth-like structure with the overlapping portions 15.

In the electronic component unit 100 configured as described above, as depicted in FIGS. 11 and 12, for example, with the housing 3 of each electronic component 1 being fitted into the main cavity 21 to be accommodated and with the electronic component 1 being locked on the accommodating member 2, the overlapping portions 15 are configured in which the housing-side wall surfaces 11 and 12 and the accommodating-member-side wall surfaces 13 and 14 constituting the leakage-blocking structure 10 overlap each other in the alignment direction of the terminals 5. Consequently, compared to the case without the overlapping portions 15, for example, the electronic component unit 100 can ensure a relatively long creepage distance between the adjacent terminals 5 by the overlapping portions 15. Thus, even if water enters the electrical junction box or condenses therein to cause adhesion of water drops on the electronic component 1, for example, the electronic component unit 100 can secure a relatively long creepage distance between the adjacent terminals 5, making it possible to prevent leakage between the adjacent terminals 5. The creepage distance herein corresponds to the shortest distance along the surface of an insulator between two conductive portions.

The leakage-blocking structure 10 described above includes: the housing-side wall surfaces 11 and 12 provided to the housing 3 of the electronic component 1 having the terminals 5 that are exposed outside the housing 3 and extend along the wall surface 35 of the housing 3, the housing-side wall surfaces 11 and 12 being interposed between the terminals 5 adjacent to each other in the alignment direction of the terminals 5; the accommodating-member-side wall surfaces 13 and 14 provided to the accommodating member 2 holding the opposite terminals 6 into which the terminals 5 are fitted, the accommodation-member-side wall surfaces 13 and 14 being interposed between the terminals 5 adjacent to each other in the alignment direction of the terminals 5; and the overlapping portions 15 formed in such a manner that the housing-side wall surfaces 11 and 12 overlap the accommodating-member-side wall surfaces 13 and 14 in the alignment direction of the terminals 5.

The electronic component 1 described above includes: the housing 3 formed in a box shape; the plurality of terminals 5 exposed outside the housing 3 and extending along the wall surface 35 of the housing 3; and the housing-side wall surfaces 11 and 12 provided to the housing 3 and interposed between the terminals 5 adjacent to each other in the alignment direction of the terminals 5. The housing-side wall surfaces 11 and 12 respectively overlap, in the alignment direction of the terminals 5, the accommodating-member-side wall surfaces 13 and 14 provided to the accommodating member 2 holding the opposite terminals 6 into which the terminals 5 are fitted, the accommodating-member-side wall surfaces 13 and 14 being interposed between the terminals 5 adjacent to each other in the alignment direction of the terminals 5.

The electronic component unit 100 described above includes: the electronic component 1 having the plurality of terminals 5 that are exposed outside the housing 3 and extend along the wall surface 35 of the housing 3; the accommodating member 2 holding the opposite terminals 6 into which the terminals 5 are fitted; and the leakage-blocking structure 10. The leakage-blocking structure 10 has the housing-side wall surfaces 11 and 12 provided to the housing 3 of the electronic component 1 and interposed between the terminal 5 adjacent to each other in the alignment direction of the terminals 5, the accommodating-member-side wall surfaces 13 and 14 provided to the accommodating member 2 and interposed between the terminals 5 adjacent to each other in the alignment direction of the terminals 5, and the overlapping portions 15 formed in such a manner that the housing-side wall surfaces 11 and 12 respectively overlap the accommodating-member-side wall surfaces 13 and 14 in the alignment direction of the terminals 5.

Thus, in the leakage-blocking structure 10, the electronic component 1, and the electronic component unit 100, the overlapping portions 15 are configured in which the housing-side wall surfaces 11 and 12 provided to the housing 3 of the electronic component 1 and interposed between the adjacent terminals 5 respectively overlap the accommodating-member-side wall surfaces 13 and 14 provided to the accommodating member 2 and interposed between the adjacent terminals 5 in the alignment direction of the terminals 5. Consequently, in the leakage-blocking structure 10, the electronic component 1, and the electronic component unit 100, the creepage distance between the adjacent terminals 5 can be secured with the overlapping portions 15, whereby leakage between the adjacent terminals 5 can be prevented.

Furthermore, in the leakage-blocking structure 10, the electronic component 1, and the electronic component unit 100 described above, the plurality of terminals 5 are led out from the inside to the outside of the housing 3 to be exposed and extend along the wall surface 35 of the housing 3. The housing 3 is formed in a box shape, and has the overhanging portions 39 that are formed so that ends of end surfaces of the housing 3 on the side to which the terminals 5 are led out and on the led-out source side of the extending direction of the terminals 5 protrude more than the terminals 5. The housing-side wall surfaces 11 and 12 are formed on the overhanging portions 39. Thus, in the leakage-blocking structure 10, the electronic component 1, and the electronic component unit 100, on the sides of the overhanging portions 39 of the housing 3, i.e., on the sides of the base-end portions 5b of the respective terminals 5, the overlapping portions 15 are formed, whereby leakage between the adjacent terminals 5 can be prevented.

It should be noted that the leakage-blocking structure, the electronic component, and the electronic component unit according to the embodiment of the present invention described above are not limited to the above-described embodiment, and various modifications can be made within the scope described in the claims.

The above-described electronic component main body 4 has been described as a relay, but is not limited to this, and may be a connector, a fuse, a branch portion, or an electronic control unit, for example.

The above-described electronic component 1 has been described as an electronic component including four terminals of the first terminal 51, the second terminal 52, the third terminal 53, and the fourth terminal 54 as a plurality of terminals 5, but is not limited to this, and may include the terminals 5 in plurality other than four. The terminals 5 have been described as terminals formed at the housing 3 along the respective wall surfaces 35 opposing each other in the second width direction, but are not limited to this, and may be formed along at least one of a pair of the wall surfaces 35 and a pair of the wall surfaces 36. Specifically, the terminals 5 may each be formed along the respective wall surfaces 36 opposing each other in the first width direction, or may each be formed along the wall surfaces 35 and the wall surfaces 36. Depending on such configuration, the overhanging portions 39, for example, may be formed.

The housing-side wall surfaces 11 and 12 and the accommodating-member-side wall surfaces 13 and 14 above have been described as wall surfaces formed as protruding wall surfaces protruding along the extending direction (height direction), but are not limited to this. For example, either the housing-side wall surfaces 11 and 12 or the accommodating-member-side wall surfaces 13 and 14 may be formed as recessed wall surfaces.

The above-described electronic component unit 100 has been described as an electronic component unit including the engaging protrusion 38 and the engaging recess 27 as a mechanism configured to lock the electronic component 1 on the accommodating member 2. However, the electronic component unit 100 does not have to include the engaging protrusion 38 and the engaging recess 27 if the electronic component 1 can be locked on the accommodating member 2 by retaining forces between the terminals 5 and the opposite terminals 6.

The above-described housing 3 has been described as a housing that is formed in a shape of rectangular parallelepiped box by the base 31 and the case 32, but is not limited to this, and may not have to be divided into the base 31 and the case 32, or may be formed in a shape of polygonal box other than rectangular parallelepiped.

In a leakage-blocking structure, an electronic component, and an electronic component unit according to the present invention, an overlapping portion is configured in which a housing-side wall surface provided to a housing of an electronic component and interposed between adjacent terminals overlaps a holding-member-side wall surface provided to a holding member and interposed between the terminals in the alignment direction of the terminals. Consequently, the creepage distance between the adjacent terminals can be secured with the overlapping portion, and thus the leakage-blocking structure, the electronic component, and the electronic component unit have an effect of being capable of preventing leakage between the adjacent terminals.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A leakage-blocking structure comprising:
   a housing-side wall surface provided to a housing of an electronic component having a plurality of terminals that are exposed outside the housing and extend along a wall surface of the housing, the housing-side wall surface being interposed between the terminals adjacent to each other in an alignment direction of the terminals;
   a holding-member-side wall surface provided to a holding member holding opposite terminals into which the terminals are fitted, the holding-member-side wall surface being interposed between the terminals adjacent to each other in the alignment direction of the terminals; and
   an overlapping portion formed in such a manner that the housing-side wall surface overlaps the holding-member-side wall surface in the alignment direction of the terminals.

2. The leakage-blocking structure according to claim 1, wherein
   the terminals are led out from inside to outside of the housing to be exposed and extend along the wall surface of the housing,
   the housing is formed in a box shape, and has an overhanging portion that is formed so that ends of an end surface of the housing on a side to which the terminals are led out and on a led-out source side of an extending direction of the terminals protrude more than the terminals, and
   the housing-side wall surface is formed on the overhanging portion.

3. An electronic component comprising:
   a housing formed in a box shape;
   a plurality of terminals exposed outside the housing and extending along a wall surface of the housing; and
   a housing-side wall surface provided to the housing and interposed between the terminals adjacent to each other in an alignment direction of the terminals, wherein
   the housing-side wall surface overlaps, in the alignment direction of the terminals, a holding-member-side wall surface provided to a holding member holding opposite terminals into which the terminals are fitted, the holding-member-side wall surface being interposed between the terminals adjacent to each other in the alignment direction of the terminals.

4. An electronic component unit comprising:
   an electronic component having a plurality of terminals that are exposed outside a housing and extend along a wall surface of the housing;
   a holding member configured to hold opposite terminals into which the terminals are fitted; and
   a leakage-blocking structure including a housing-side wall surface provided to the housing of the electronic component and interposed between the terminals adjacent to each other in an alignment direction of the terminals, a holding-member-side wall surface provided to the holding member and interposed between the terminals adjacent to each other in the alignment direction of the terminals, and an overlapping portion formed in such a manner that the housing-side wall surface overlaps the holding-member-side wall surface in the alignment direction of the terminals.

* * * * *